United States Patent [19]

Chung

[11] Patent Number: 4,926,429
[45] Date of Patent: May 15, 1990

[54] LIGHTWAVE COMMUNICATION SYSTEM HAVING SOURCES INDEPENDENTLY SYNCHRONIZED TO AN ABSOLUTE FREQUENCY STANDARD

[75] Inventor: Yun C. Chung, Aberdeen, N.J.

[73] Assignee: AT&T Bell Laboratories, Murray Hill, N.J.

[21] Appl. No.: 379,292

[22] Filed: Jul. 13, 1989

[51] Int. Cl.⁵ .............................................. H01S 3/13
[52] U.S. Cl. .................................... 372/32; 455/609
[58] Field of Search ..................... 372/29, 32; 455/609

[56] References Cited

U.S. PATENT DOCUMENTS

4,833,681  5/1989  Akiyama et al. .................... 372/32

OTHER PUBLICATIONS

Yanagawa et al., Appl. Phys. Lett., 47(10), 1985, pp. 1036-1038, "Frequency Stabilization of an InGaAsP Distributed Feedback . . . ".
Chung et al., Elect. Lett., vol. 23, No. 20, 1987, pp. 1044-1045, "450 Hz Relative Frequency Stability in an AlGaAs Diode Laser".
Koizumi et al., Elect. Lett., vol. 24, No. 1, 1988, pp. 13-14, "Frequency Stabilization of Semiconductor Laser Using Atomic . . . ".
Y. Yamamoto, IEEE J. of Quantum Elec., vol. QE—17, No. 6, June, 1981, "Coherent Optical Fiber Transmission Systems", pp. 919-935.
T. Okoshi, IEEE Trans. on Microwave Theory & Techniques, Voo. MIT—30, No. 8, "Heterodyne and Coherent Optical . . . ", Aug., 1982, pp. 1138-1149.
Green et al., Appl. Phys. Lett., vol. 29, No. 11, pp. 727-729 (1976), "Galvanic Detection of Optical Absorptions . . . ".
Green et al., IEEE J. of Quantum Elect., QE—13, No. 2, 1977, "Use of an Opto—Galvanic Effect to Frequency—Lock . . . ", pp. 63-64.
Yamaguchi et al., Appl. Phys. Lett., 41(7), 1982, "Frequency Stabilization of a Diode Laser . . . ", pp. 597-598.
Yamaguchi et al., Appl. Phys. Lett., 41(11), 1982, "Frequency Locking of an InGaAsP Semiconductor . . . ", pp. 1034-1036.
Nielsen et al., J. Opt. Commun. 4 (1983) 4, pp. 122-125, "Frequency Stabilization of Singlemode Semiconductor . . . ".
Yamaguchi et al., IEEE J. of Quant. Elect., QE—19, No. 10, 1983, "Simultaneous Stabilization of the Frequency . . . ", pp. 1514-1519.

*Primary Examiner*—James W. Davie
*Attorney, Agent, or Firm*—Gregory C. Ranieri

[57] ABSTRACT

Heterodyne and homodyne lightwave communication systems require transmitter optical sources and receiver local oscillators to be locked to a particular frequency. In accordance with the present invention, each transmitter laser and each receiver local oscillator laser is independently and locally stabilized to the same absolute frequency standard using species exhibiting atomic or molecular absorption lines in the wavelength range of interest. Frequency stabilization of the lasers is achieved by employing an optogalvanic effect element in a feedback control loop with the laser. Absolute frequency standards are obtained using gas discharge tubes containing, for example, noble gases such as argon (1.2 $\mu$m to 1.4 $\mu$m) and krypton (1.4 $\mu$m to 1.6 $\mu$m) and the like. Standard synchronous detection and feedback control techniques are used to insure proper long-term frequency stability.

11 Claims, 6 Drawing Sheets

LIGHTWAVE COMMUNICATION SYSTEM HAVING SOURCES INDEPENDENTLY SYNCHRONIZED TO AN ABSOLUTE FREQUENCY STANDARD

TECHNICAL FIELD

This invention relates to lightwave communication systems and, more particularly, to wavelength or frequency stabilization techniques for use in such systems.

BACKGROUND OF THE INVENTION

Coherent lightwave communication systems are continuing to be designed in the long wavelength regime from 1.2 μm to 1.6 μm using Group III-V semiconductor lasers to take advantage of optical fiber loss minima. Two main advantages to such systems are nearly ideal receiver sensitivity and improved frequency selectivity.

In coherent lightwave communication system applications, it is necessary to maintain reasonably close tolerances on wavelength (frequency) stability of the optical sources. (It is understood that, because of the mathematical relationships between "wavelength" and "frequency", these terms are used interchangeably herein without loss of generality.) That is, transmitter sources and receiver local oscillator sources must be synchronized to a common wavelength or to two separate wavelengths having a constant wavelength offset from each other. Unfortunately, semiconductor lasers exhibit sufficiently large frequency drifts due to junction temperature and injection current variations that their use as transmitter sources, receiver local oscillators, system frequency references, or reference clocks in such systems is made feasible only after the addition of complicated frequency control or compensation loops to stabilize and control the wavelength of the semiconductor laser.

Frequency stabilization techniques for semiconductor lasers have been widely discussed in the technical literature since the early part of the present decade. While the scope of techniques discussed is quite broad to include the use of Fabry-Perot interferometers and atomic or molecular transition lines as references, most reports are limited to the short wavelength region involving AlGaAs lasers which operate around 0.8 μm. See, for example, C. J. Nielsen et al., *J. Opt. Commun.*, Vol. 4, pp. 122-5 (1983) dealing with the use of Fabry-Perot interferometers; S. Yamaguchi et al., *IEEE J. Quantum Electron.* Vol. QE-19, pp. 1514-9 (1983) on the use of atomic transition lines; and H. Tsuchida et al., *Jpn. J. Appl. Phys.*, Vol. 21, pp. L1-L3 (1982) on the use of molecular transition lines.

Fabry-Perot interferometric techniques are vulnerable to long term drifts caused by fluctuations of the resonant cavity. Longer term stability is afforded by using atomic or molecular transition lines. Of the latter approaches, atomic transition lines are preferred over molecular transition lines. Atomic spectra offer relatively few, widely separated and, therefore, easily identifiable strong lines. On the other hand, molecular transition line spectra are complex and weak which, in turn, results in the need for very long absorption cells as a reference.

Only a few articles have reported experiments for semiconductor laser frequency stabilization on longer wavelength semiconductor lasers operating above 1.2 μm. Such sources are usually based on Group III-V materials such as InGaAsP/InP. The reported experiments solely employ molecular transition lines as references. In one experiment, absorption lines of the ammonia ($NH_3$) molecule are used to frequency stabilize an InGaAsP distributed feedback laser. See, T. Yanagawa et al., *Appl. Phys. Lett.*, Vol. 47, pp. 1036-8 (1985). Another experiment employed first overtone vibration-rotation lines of hydrogen fluoride (HF) molecules to frequency lock an InGaAsP laser. See, S. Yamaguchi et al., *Appl. Phys. Lett.*, Vol. 41, pp. 1034-6 (1982). One other experiment utilized absorption lines of water vapor ($H_2O$) molecules and ammonia molecules in spectral measurements for pollutant gas monitoring. See M. Ohtsu et al., *Jpn. J. Appl. Phys.*, Vol. 22, pp. 1553-7 (1983).

It is noteworthy that experiments reported in the long wavelength region are restricted to using only molecular transition lines. In part or in whole, this is apparently due to the fact that there has been much reported difficulty, and there have been no reported successes, in finding useful atomic transitions in this wavelength region emanating from the ground state. But, a careful review of the literature shows that one need not be restricted to only those frequency stabilization techniques which employ atomic transitions from the ground state. It is well known to use optogalvanic signals corresponding to transitions from excited atomic states for stabilizing short wavelength AlGaAs semiconductor lasers. See, for example, S. Yamaguchi et al., *IEEE J. Quantum Electron.*, Vol. QE-19, 1514-9 (1983) describing the optogalvanic effect of krypton.

Unfortunately, extension of the optogalvanic effect to frequency stabilization techniques for longer wavelength semiconductor lasers was cast in serious doubt in 1982 when the recognized experts in the field stated that output power from longer wavelength semiconductor lasers (InGaAsP/InP) is insufficient to produce an impedance change in the discharge tube. Since the optogalvanic effect concerns large impedance changes of the gas discharges by optical (laser) irradiation at wavelengths corresponding to non-ionizing transitions of species present in the discharge, the experts deduced that the optogalvanic signals would be difficult, at best, to detect for the longer wavelength lasers. See, S. Yamaguchi et al., *Appl. Phys. Lett.*, Vol. 41, pp. 1034 (1982). It is reasonable to surmise that the failure to have published works over the last score on the extension of the optogalvanic signal techniques for frequency stabilization developed and improved by yamaguchi et al. at short wavelengths is, in large part, due to the chilling effect on other researchers of the experts' own published statement which knowingly predicts failure of the technique at longer wavelengths.

When applied to lightwave communication systems, absolute frequency standards have been suggested for stabilizing semiconductor lasers in transmitters whereas frequency (IF) stabilization via feedback control circuits have been used for locking receiver local oscillators substantially to the transmitter frequency (i.e., at the transmitter frequency or slightly offset from that frequency). In known coherent lightwave communication systems, regardless of the stabilization method for the transmitter source, IF tracking and correction circuits at the receiver have been and are continuing to be used to stabilize each receiver local oscillator in synchronism with the frequency of the transmitter source. See, for example, Y. Yamamoto et al., *IEEE J. of Quantum Electronics*, Vol. QE-17, No. 6, pp. 919-935, 923

(1981) wherein absolute stabilization is employed at the transmitter laser and IF locking feedback control circuitry is employed for the receiver local oscillator laser.

SUMMARY OF THE INVENTION

Precise and instantaneous stabilization of semiconductor lasers in a lightwave communication system to the same frequency is accomplished autonomously and locally by employing absolute frequency standard elements operating via the optogalvanic effect in a feedback control loop with each individual laser. Absolute frequency standard elements exhibit atomic transition lines and are embodied in gas discharge tubes containing, for example, noble gases such as argon (1.2 $\mu$m to 1.4 $\mu$m) and krypton (1.4 $\mu$m to 1.6 $\mu$m) and the like. Other absolute frequency standard elements exhibit molecular transition lines from ammonia, water vapor, hydrogen fluoride and the like. Standard synchronous detection and feedback control techniques are used to insure proper absolute frequency stabilization.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Coherent lightwave communication systems are divided into at least two major categories according to the type of reception employed, namely, heterodyne reception or homodyne reception. Heterodyne reception employs a coherent receiver which mixes the incoming lightwave signal with a locally generated lightwave signal of different frequency. Signal mixing creates a new signal at the intermediate frequency (IF), i.e., the difference frequency or beat frequency between the incoming and locally generated lightwave signals. In homodyne reception, the coherent receiver combines the incoming lightwave signal with a locally generated lightwave signal of substantially the same frequency. This is also known as zero-beat reception.

For either heterodyning or homodyning, information present on the original incoming lightwave signal is translated to IF or baseband. The translated signal may be demodulated using standard electrical demodulation techniques. It should be noted that for homodyning, the demodulated signal appears directly at baseband.

Coherent systems offer many combinations of modulation formats and detection techniques because phase and frequency information of the incoming lightwave signal is maintained throughout the mixing process.

Figure 1:
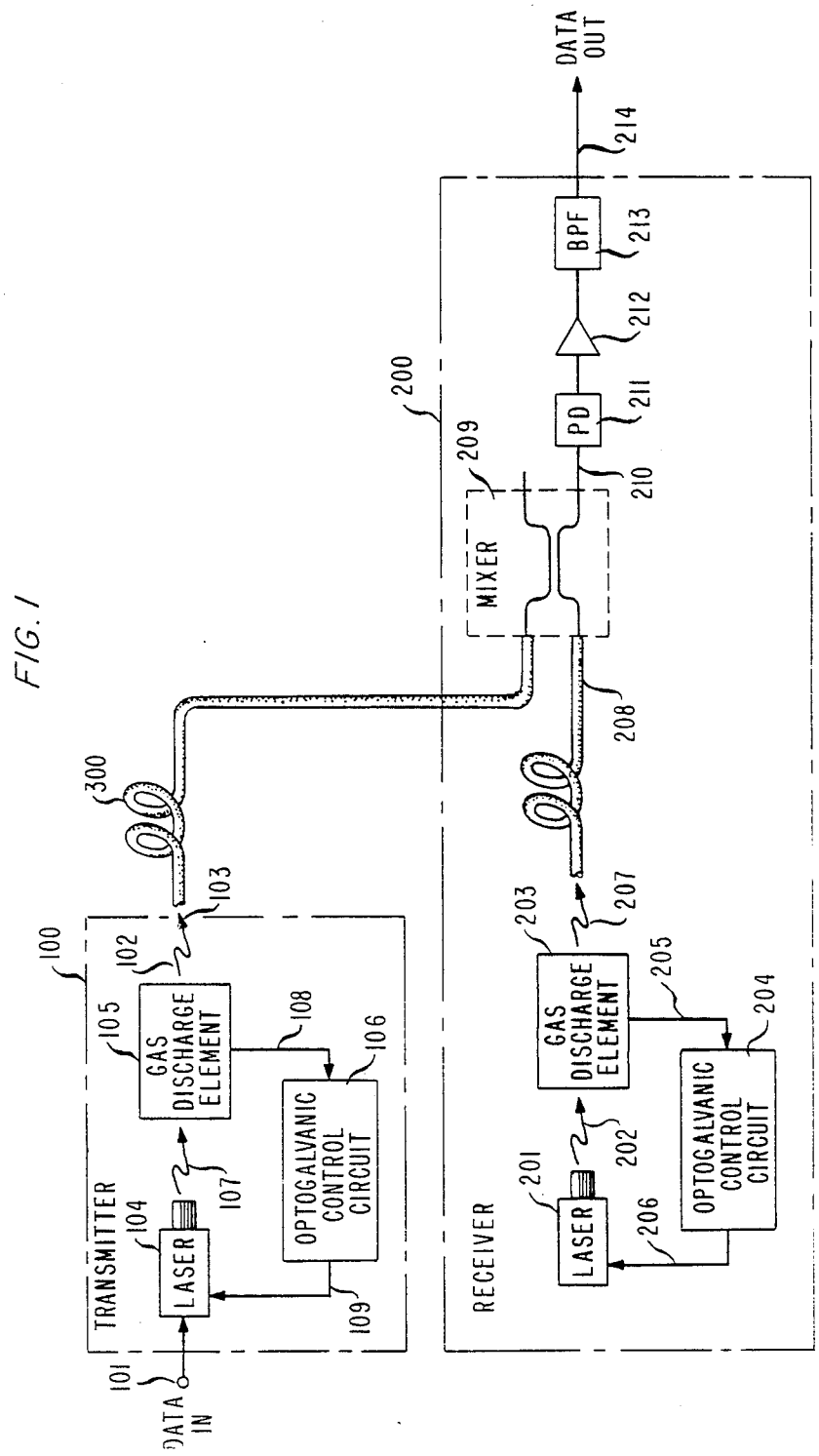
FIG. 1 shows a simplified blocked diagram of a lightwave communication system having sources independently synchronized to the same absolute frequency standards in accordance with the principles of the invention.

FIG. 1 shows an exemplary coherent lightwave communication system in simplified block diagram form. Data 101 are provided to transmitter 100 for modulation and transmission of lightwave signal 102. Lightwave signal 102 is transmitted over transmission medium 300 to lightwave receiver 200. The received lightwave signal is mixed with a locally generated signal in mixer 209 to produce the IF signal which is processed to extract output data 214.

In the system shown in FIG. 1, the transmitter and receiver each include laser sources which are independently locked to an absolute frequency standard provided by atomic or molecular transition lines using optogalvanic effect devices and feedback control circuits. This ensures that all lasers in the system are initially and autonomously locked to the same lasing wavelength. As a result, the system can initiate communication without any manual adjustment to synchronize the frequencies of the transmitter laser and the receiver local oscillator laser. That is, the system has a "cold start" capability. In addition, it will be apparent to those skilled in the art that the present system does not require any IF locking circuit which is required by all prior conventional heterodyne/homodyne detection lightwave communication systems to match the transmitter and local oscillator laser frequencies.

Using either the optogalvanic effect or absorption, noble gases offer excellent reference sources which can be employed to lock the laser frequency. The spectral range covered by argon, krypton, neon and xenon gases includes many transition lines over the 0.8 $\mu$m to 1.6 $\mu$m range, which is well suited to many semiconductor lasers and especially the Group III-V based lasers. Many molecular transition lines from molecules such as ammonia, hydrogen fluoride, water vapor and the like may be used as absolute frequency standards for frequency locking lasers to a particular frequency. It should be noted that atomic transition lines are generally preferred over molecular transition lines because the frequency separation between most useful atomic transition lines ($\geq$1000 GHz) comfortably exceeds the tuning range of semiconductor lasers.

As shown in FIG. 1, the system includes transmitter 100 connected to receiver 200 over transmission medium 300. The transmitter and receiver include individual laser sources which are independently synchronized to an absolute frequency standard provided by the gas species in the gas discharge elements. Although the lightwave communication system shown in FIG. 1 is presented in overly simplified form, it will be understood by those skilled in the art that the principles of the invention described below are extendable to a lightwave communication system incorporating many transmitters and receivers such as WDM networks and the like.

As shown in FIG. 1, transmitter 100 responds to a high speed data signal supplied to input terminal 101 and, as a result, generates a modulated optical output signal 102 at output port 103. Modulated optical output signal 102 is then transmitted over transmission medium 300. While the exemplary system shown in FIG. 1 is described as a direct modulation system (laser directly modulated by the data), it is contemplated that indirect modulation using external modulators, for example, may also be used in the transmitter without affecting the absolute frequency stabilization.

Transmitter 100 includes semiconductor laser 104, gas discharge element 105 and optogalvanic control circuit 106. When biased to a lasing condition, laser 104 emits optical signal 107 at a characteristic wavelength generally known as the photoluminescence wavelength, $\lambda_p$. This signal is directed onto and passes substantially undiminished in intensity through gas discharge element 105 to emerge as signal 102. In response to optical signal 107 from the laser, gas discharge element 105 generates an electrical signal on lead 108 via the optogalvanic effect. This electrical signal is supplied to optogalvanic control circuit 106. Optogalvanic control circuit 106 processes the electrical signal and, thereby, controls the wavelength of laser 104 via lead 109 to match the absolute frequency standard set by the atomic or molecular transition line of the gas species in gas discharge element 105. Details concerning the operation of a gas discharge element and the optogalvanic control circuit are given below in the description related to FIGS. 2 through 6.

Transmission medium 300 connecting optical signals from transmitter 100 to an input of receiver 200 generally comprises spans of optical fiber or combinations of optical star couplers and optical fibers which are well known in the art for supporting propagation of optical signals between transmitters and receivers.

Receiver 200 includes a local oscillator, a mixer and additional processing elements to extract the data signal from the received lightwave signal. The received lightwave signal is directed from transmission medium 300 to one input port of mixer 209. A reference signal from the local oscillator is directed via path 208 to the other input port of mixer 209. Path 208 may include a free space path as well as any guided form of lightwave transmission medium. In mixer 209, the received lightwave signal is combined with the reference signal to produce a mixer output signal on path 210, which may include free space as well as any guided form of transmission medium.

The local oscillator comprises laser 201, gas discharge element 203 and optogalvanic control circuit 204 connected as shown in FIG. 1. As such, the local oscillator duplicates the combination and functionality of the arrangement shown as transmitter 100. In contrast to prior local oscillators and their related stabilization circuits, the present local oscillator eliminates the need to acquire and use the received (transmitter) signal for locking the frequency of the local oscillator.

For coherent homodyne reception, it is desirable to stabilize lasers 104 and 201 to have substantially identical photoluminescence wavelengths. For coherent heterodyne reception, it is desirable to select species which have atomic or molecular transition lines at the two different frequencies necessary for heterodyning. In the alternative, identical atomic or molecular transition lines may be used at the transmitter and receiver for independent frequency stabilization of the transmitter and local oscillator lasers. For the latter example, the offset frequency between the lasers can be achieved by using a specific modulation format (such as FSK in the example described below) or by offset locking the local oscillator by applying the Stark effect or the Zeeman effect to the transition line. The Stark effect results in the required frequency shift of the appropriate transition line in response to an externally applied electric field, whereas the Zeeman effect results in the required frequency shift of the appropriate transition line in response to an externally applied magnetic field. Both heterodyne and homodyne operation and the embodiments permitting such operation are contemplated herein.

Details of operation for the receiver local oscillator are given below as follows. When biased to a lasing condition, laser 201 emits optical signal 202 at a characteristic wavelength generally known as the photoluminescence wavelength. This signal is directed onto and passes substantially undiminished in intensity through gas discharge element 203 to emerge as signal 207. In response to optical signal 202, gas discharge element 203 generates an electrical signal on lead 205 via the optogalvanic effect. This electrical signal is supplied to optogalvanic control circuit 204. Optogalvanic control circuit 204 processes the electrical signal and, thereby, controls the wavelength of laser 201 via lead 206 to match the absolute frequency standard set by the atomic or molecular transition line of the gas species in gas discharge element 203. As stated above, details concerning the operation of the gas discharge element and the optogalvanic control circuit are given below in the description related to FIGS. 2 through 6.

Processing of the mixer output signal is performed as follows. Photodetector 211 (e.g., InGaAs PIN diode) converts the optical signal on path 210 to an electrical signal. The electrical signal from the photodetector is then amplified by amplifier 212 and subsequently demodulated. Bandpass filter 213 shown in FIG. 1 is by example for the particular case of coherent heterodyne reception of an FSK modulated signal. This example is described below in more detail.

At the present time, a practical coherent lightwave communication system is a wide-deviation FSK system employing coherent heterodyne reception. This system can afford relatively large linewidth laser operation while permitting direct modulation of the transmitter laser source by the data. In particular, binary data will cause the laser output signal to be modulated between a "mark" frequency for a binary one to a "space" frequency for a binary zero. The frequency difference ($\Delta f$) between the "mark" frequency and the "space" frequency is generally optimized for a given laser linewidth and data bit rate. See Foschini et al., *IEEE Transactions on Communications*, Vol. 36, pp. 306-314 (1988). Either the "mark" frequency or the "space" frequency of the transmitter laser is locked to the absolute frequency standard.

The received signal from the frequency locked, FSK modulated transmitter laser is mixed with the local oscillator signal locked to the same frequency standard. The resulting signal is an exact replica of the modulated lightwave signal at baseband, i.e., "space" data appears at 0 Hz whereas "mark" data will appear at a frequency equal to $\Delta f$ Hz. Following photodetection of the mixer output signal, demodulation proceeds by using a simple bandpass filter having a passband centered around the "mark" frequency, $\Delta f$ Hz to convert the FSK signal to ASK by eliminating the "space" portion of the signal. An envelope detector (not shown) completes the demodulation.

In an example from experimental practice, NRZ pseudorandom data at 50 Mbps was used to directly modulate a tunable, two-section, multiple quantum well, InGaAsP/InP, distributed Bragg reflector laser operating nominally at 1.5 $\mu$m. The laser was roughly tuned using the gain section and the Bragg section with currents of approximately 103 mA and 5 mA, respectively. The frequency difference between the "space" frequency and the "mark" frequency was set at approximately Δf=2 GHz. Using the optogalvanic effect from independent krypton-filled hollow cathode lamps, the transmitter laser and the receiver local oscillator laser (also, a tunable, two-section, multiple quantum well, InGaAsP/InP, distributed Bragg reflector laser operating nominally at 1.5 μm) were frequency locked to the Kr $2p_8$-$3d_1''$ at 1.5224 μm for a "space". The receiver local oscillator laser was locked independently to the same transition line as the transmitter laser by coarse tuning with currents of 93 mA (gain section) and 27 mA (Bragg section). The mixer output signal centered over the "mark" frequency (2 GHz) with a 3 dB bandwidth of 1.3 GHz converts the FSK "mark" signal to ASK. Demodulation is completed by an envelope detector.

It should be noted that the lasers employed in the system also were tuned using temperature tuning elements which are well known in the laser stabilization art. In general, coarse tuning is accomplished by temperature tuning which permits variations greater than 10 GHz/°C. whereas finer tuning is accomplished through current injection which permits variations on the order of GHz/mA.

As described herein, any system developed in accordance with the principles of the present invention avoids the need for IF locking feedback control circuits to bring the transmitter and local oscillator lasers into frequency synchronism. This is especially important because of the cost and complexity of such control circuits which generally include power dividers, delay lines, mixers and wideband amplifiers. Moreover, frequency acquisition systems are totally eliminated.

Figure 2:
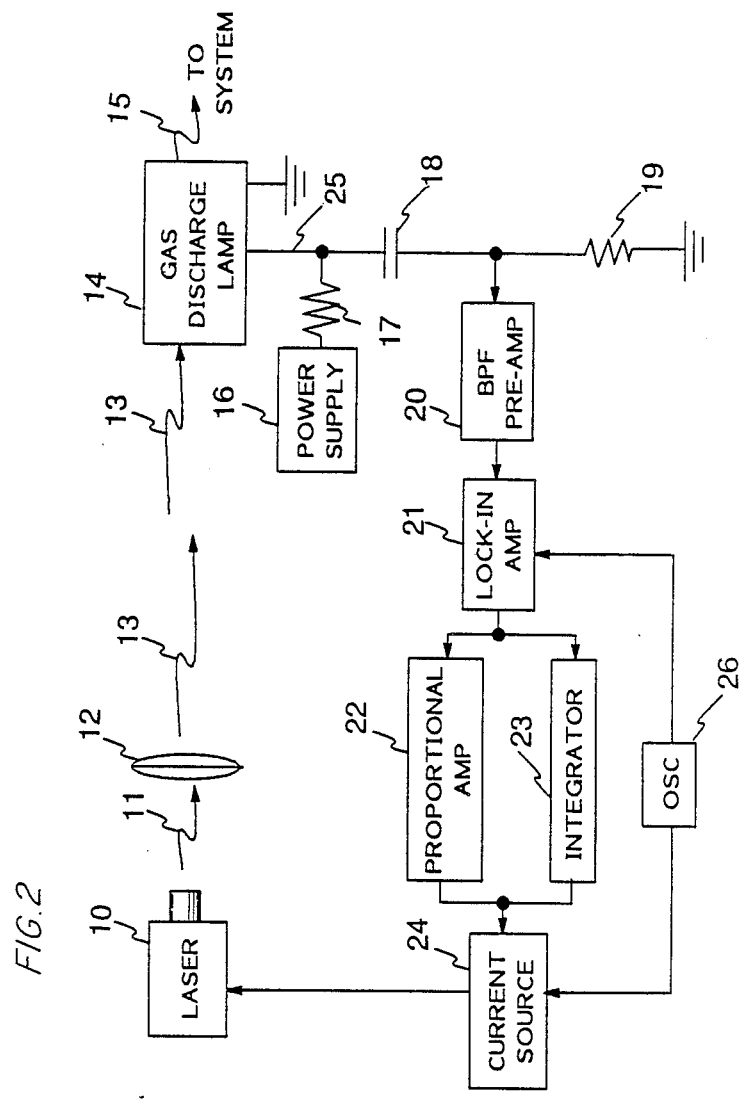
FIG. 2 shows a block diagram of an exemplary frequency stabilization arrangement for a long wavelength semiconductor laser in accordance with the principles of the invention.

The arrangement in FIG. 2 is intended to show additional details about the frequency stabilization arrangements for transmitter laser 104 and local oscillator laser 201 in FIG. 1. FIG. 2 shows a block diagram of an embodiment of a frequency stabilization arrangement for a long wavelength semiconductor laser. The term, "long wavelength semiconductor laser", is intended to include those semiconductor lasers operating in a wavelength region above 1.2 μm. In this wavelength region, group III-V semiconductor materials derived from InGaAsP compositions are suitable for fabricating long wavelength lasers as defined herein.

As shown in FIG. 2, laser 10 generates optical signal 11 which is collimated and focused by lens 12 onto gas discharge lamp 14. Optical signal 13 is incident on gas discharge lamp 14 to induce the optogalvanic signal to occur on lead 25 from the gas discharge lamp. Optical signal 13 passes through the gas discharge lamp to emerge substantially undiminished as optical signal 15. After an initial settling period, optical signals 11, 13, and 15 are stabilized to the wavelength (frequency) of the desired transition line.

The optogalvanic signal (frequency discriminant signal) on lead 25 from gas discharge lamp 14 occurs as a result of the optogalvanic effect. As presently understood, the optogalvanic effect is observed as a change in the voltage across a low pressure gas discharge tube produced by irradiation with intense monochromatic light (laser light) tuned to a transition wavelength of the gas species present in the discharge. It should be understood by those skilled in the art that gas discharge tubes or lamps include indicator lamps and hollow cathode lamps.

Power supply 16 limited through ballast resistor 17 supplies a constant current to gas discharge lamp 14 via lead 25. The optogalvanic signal is supplied by lead 25 to the feedback control loop. This loop includes coupling capacitor 18, monitoring resistor 19, optional bandpass filter and preamplifier 20, lock-in amplifier 21, proportional amplifier 22, integrator 23, current source 24 and oscillator 26. The elements in the feedback loop are connected substantially as shown in FIG. 1. This feedback loop arrangement for controlling laser 10 is well known to those skilled in the art. See, for example, S. Yamaguchi et al. *IEEE J. Quant. Elect.*, Vol. QE-19, No. 10, p. 1514 (1983).

Output lead 25 from gas discharge lamp 14 is connected to an AC coupling capacitor 18. The output AC voltages changes are monitored by resistor 19 and are supplied to bandpass filter and preamplifier 20. Bandpass filter and preamplifier 20 is an optional element and is designed to have a narrow passband centered substantially about the oscillator frequency. The output signal from bandpass filter and preamplifier 20, if used, is supplied to lock-in amplifier 21. Lock-in amplifier 21 is used to synchronously detect the signal generated by the gas discharge lamp. The first derivative signal caused by the frequency dithering is used as a frequency discriminant in the feedback control loop. The output from lock-in amplifier 21 is supplied along parallel paths to proportional amplifier 22 and integrator 23. The combined output signal from proportional amplifier 22 and integrator 23 is an error signal which is used to correct the bias current supplied to laser 10 by current source 24. This correction and bias current results in a correction of the nominal operating wavelength of the laser. Typically, the frequency of the laser 10 is initially adjusted by temperature (coarse adjustment) or by injection current (fine adjustment) or by a combination of temperature and injection current to have a nominal operating wavelength within several GHz of the desired atomic transition line wavelength as described above. The feedback control loop serves to bring the nominal operating wavelength of the laser into substantial coincidence (frequency synchronism) with the wavelength of the desired transition line.

Oscillator 25 is connected to both lock-in amplifier 21 and current source 24. Oscillator 25 provides a low frequency dither signal to laser 10 and to the feedback control loop for establishing source modulation to detect the optogalvanic signal. The low frequency dither signal is generally on the order of several kHz.

Figure 3:
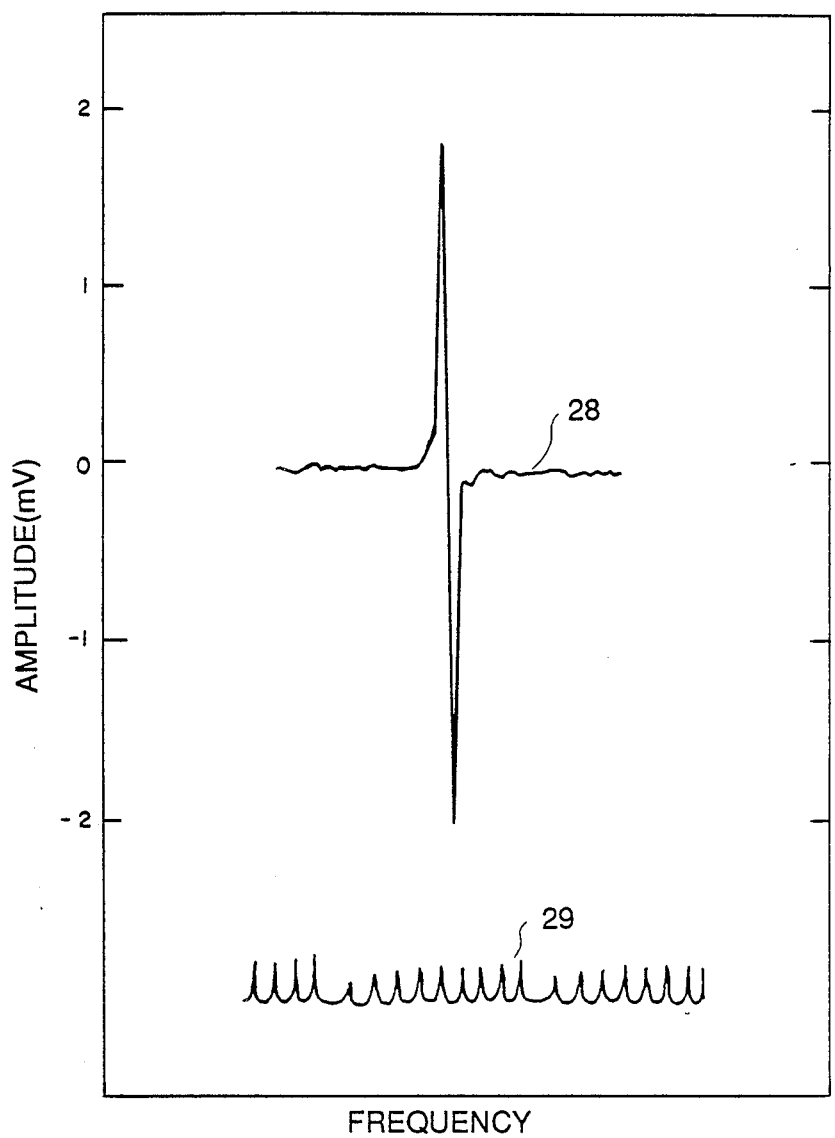
FIG. 3 shows an exemplary first derivative signal of an atomic transition obtained from a gas discharge lamp utilized in the arrangement from FIG. 2.

FIG. 3 shows an exemplary first derivative signal 28 measured by lock-in amplifier 21. Signal 28 is the first derivative signal of Kr $2p_{10}$-$3d_3$ transition (1.5339 μm). The lower trace shown in FIG. 3 as signal 29 is a sequence of frequency markers of interference fringes for a confocal Fabry-Perot interferometer having a free spectral range of 750 MHz. The markers permit measurement of the peak-to-peak width of the first derivative signal which, in this case, is approximately 380 MHz at a slope of approximately 10 μV/MHz near the atomic transition line wavelength.

Figure 4:
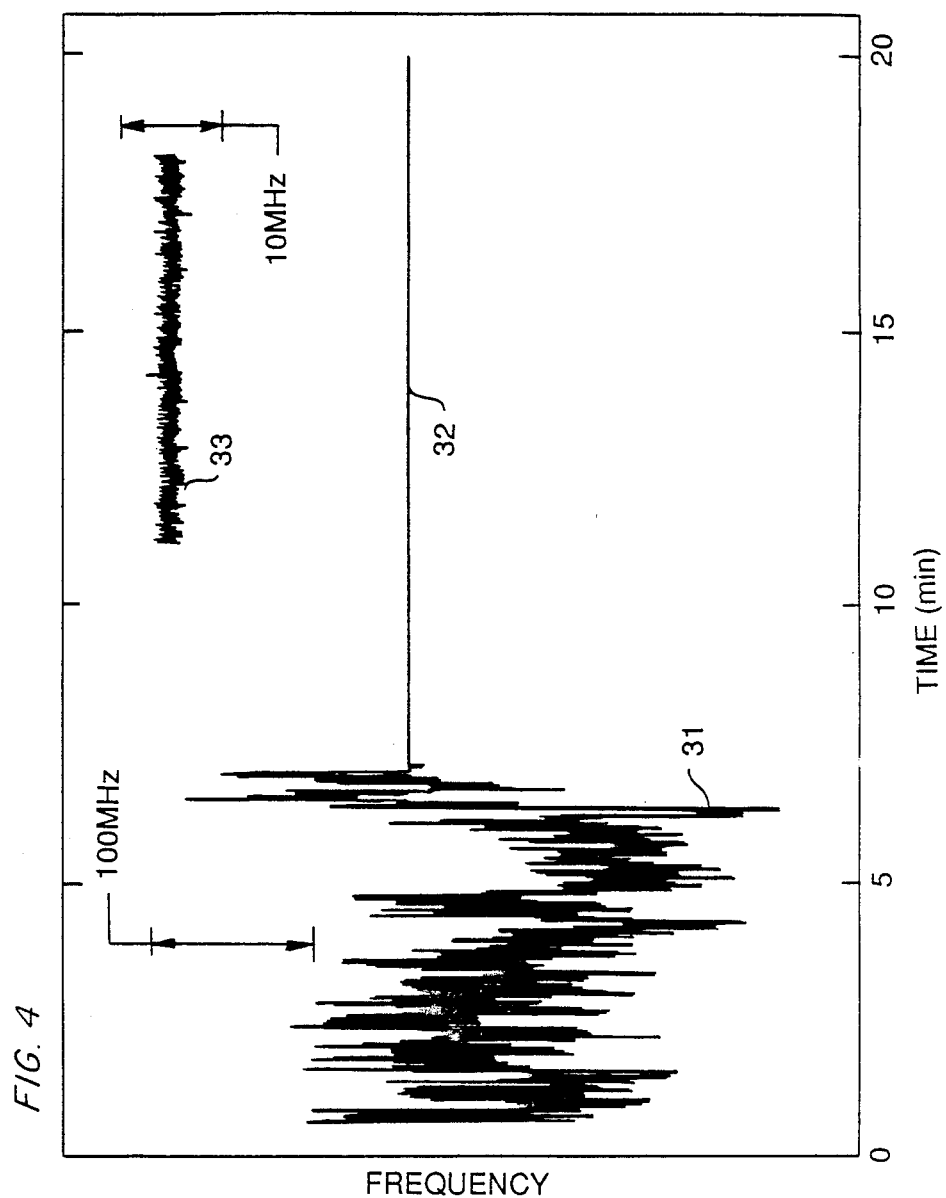
FIG. 4 shows an error signal trace with the laser free-running and frequency stabilized.

FIG. 4 depicts an error signal trace with laser 10 initially in a free running mode (open loop) and finally in a frequency stabilized mode (closed loop). This trace was actually measured using a hollow cathode lamp exhibiting the Kr $2p_{10}$-$3d_3$ transition (1.5339 μm). Free running operation is indicated by curve 31 wherein peak-to-peak frequency fluctuations exceeded 300 MHz. Curve 32 and curve 33 (a 10× magnification of curve 32) show that frequency fluctuations during frequency stabilized operation were substantially reduced to a few MHz.

It has been found by me experimentally that long wavelength semiconductor lasers can be frequency stabilized by using optogalvanic signals from gas discharge lamp containing a noble gas species. The optogalvanic signals are input to a standard feedback control loop or servo loop to bring the nominal operating wavelength of the laser into substantial coincidence with the desired transition line wavelength for the species in the gas discharge lamp. In most cases, it is necessary only to adjust the bias current to the long wavelength semiconductor laser to achieve frequency locking. Although it has not been shown, it may also be desirable to adjust the operating temperature of the laser in order to achieve large scale frequency corrections and, thereby, frequency locking.

In an example from experimental practice frequency locking has been achieved using an InGaAsP distributed feedback laser mounted on a thermoelectrically cooled copper heat sink. The temperature of the heat sink was regulated to within $0.1°$ C. The frequency tunability of the laser was 1.8 GHz/ma and 14.2 GHz/°C. The nominal operating wavelength of the laser was adjusted to a region where the optogalvanic signal corresponding to the Ar $2p_{10}$-$3d_5$ transition (1.2960 $\mu$m) is expected to be observed. In order to accomplish this initial adjustment, the operating temperature and the injection current for the laser were set to 8° C. and 65 ma, respectively. Gas discharge lamp 14 was an Ar filled miniature glow lamp (General Electric AR9) having a diameter of approximately 0.6 cm and a length of approximately 2.3 cm. Normal glow discharge was maintained with a discharge current in excess of 35 $\mu$a. The lamp was discharged by a 100 volt power supply dropping approximately 80 volts across the lamp. Laser power incident on the lamp was approximately 1 mW. To obtain the frequency discriminant signal at the output of lock-in amplifier 21, oscillator 26 dither the injection current to the laser sinusoidally in small amounts (85 $\mu$a) at approximately 2 kHz. Frequency stability during closed loop operation was observed at better than 13 MHz.

Figure 5:
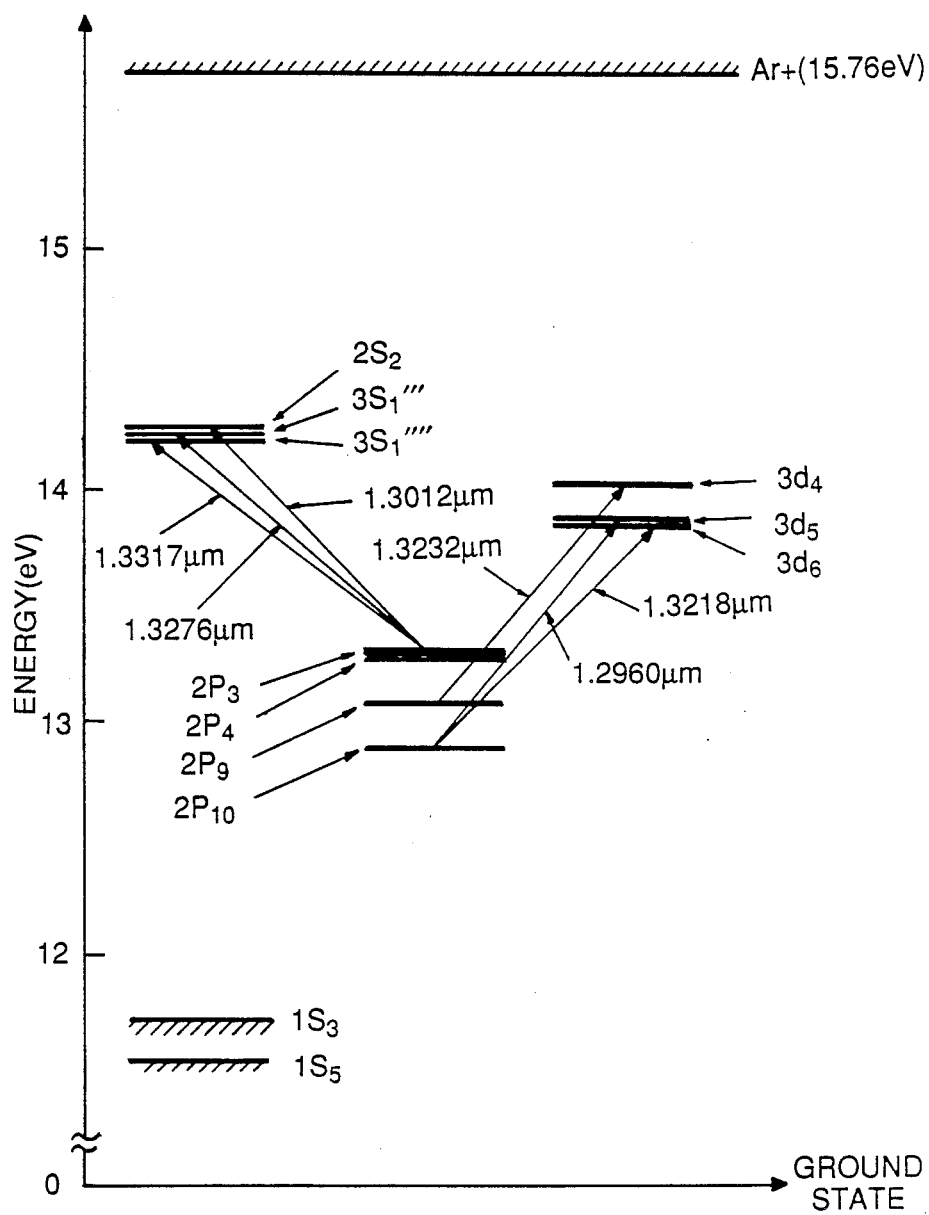
FIGS. 5 and 6 show partial energy diagrams for argon and krypton, respectively.
Figure 6:
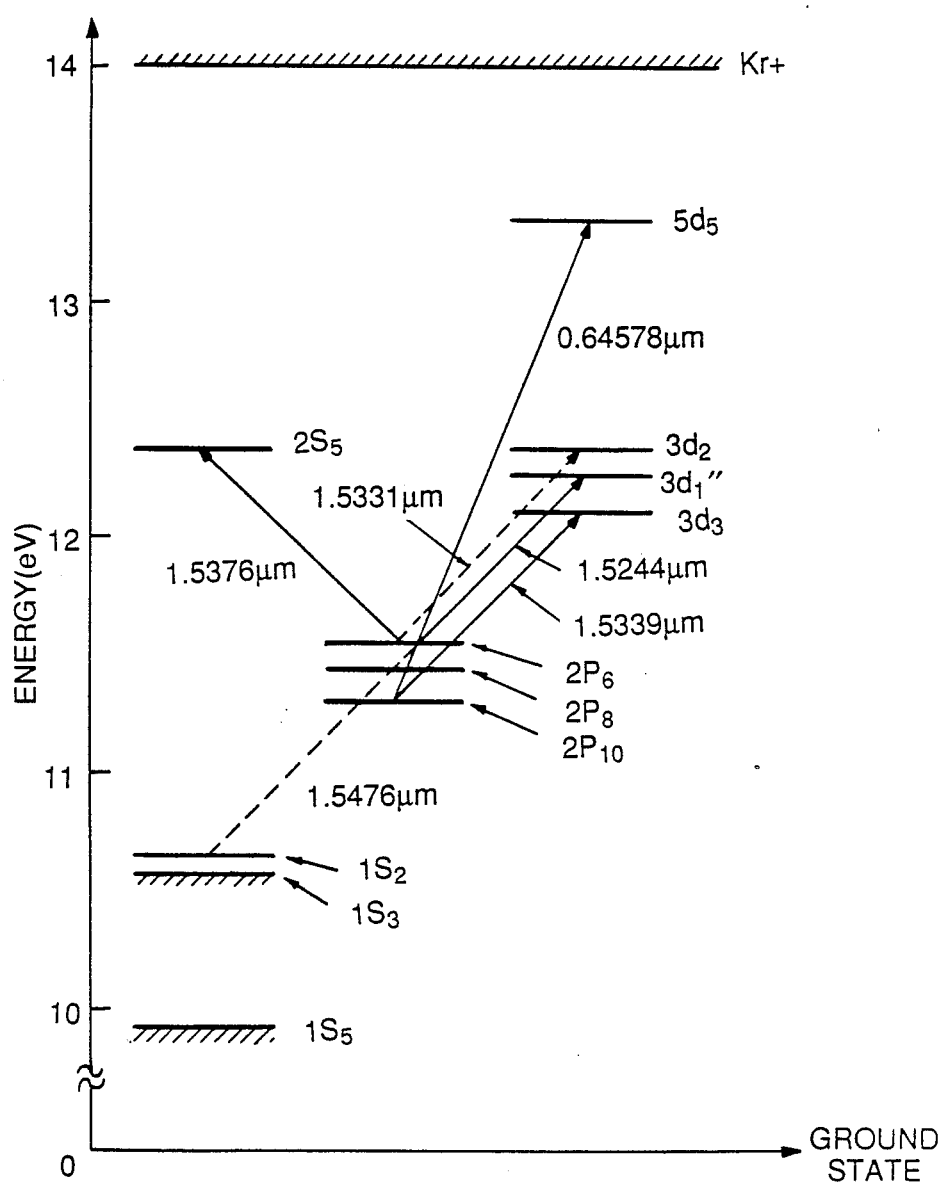

It is contemplated that long wavelength semiconductor lasers may be frequency stabilized to many atomic transitions lines for noble gasses in the long wavelength regime. FIGS. 5 and 6 show a plurality of atomic transition lines for noble gasses in the long wavelength regime. Such atomic transition lines are obtainable in gas discharge lamps which are commercially available such as the glow lamp described above, hollow cathode lamps containing krypton or other noble gasses, and the like.

FIG. 5 shows a partial energy diagram for argon. Atomic transition lines are shown with corresponding wavelengths in the 1.2 $\mu$m to 1.4 $\mu$m range for the related transition. Transitions in this wavelength range and their particular wavelengths are as follows:

| Transition | Wavelength ($\mu$m) |
|---|---|
| $2p_{10}$-$3d_5$ | 1.2960 |
| $2p_3$-$2s_2$ | 1.3011 |
| $2p_{10}$-$3d_6$ | 1.3217 |
| $2p_9$-$3d_4$ | 1.3231 |
| $2p_3$-$3s_1'''$ | 1.3276 |

In addition to the transition lines described above, the following transition lines are exhibited by Argon:

| Transition | Wavelength ($\mu$m) |
|---|---|
| $2p_2$-$3s_1'$ | 1.2705 |
| $2p_8$-$2s_5$ | 1.2736 |
| $2p_4$-$2s_2$ | 1.2749 |
| $2p_8$-$3d_1''$ | 1.2806 |
| $2p_4$-$2s_3$ | 1.2936 |
| $2p_4$-$3s_1''''$ | 1.3316 |
| $2p_6$-$3d_1$ | 1.3370 |
| $2p_8$-$3d_4$ | 1.3507 |
| $2p_1$-$3s_1'$ | 1.5050 |
| $2p_8$-$3d_3$ | 1.5333 |
| $2p_5$-$2s_4$ | 1.5177 |

FIG. 6 shows a partial energy diagram for krypton. Atomic transition lines are shown with corresponding wavelengths in the 1.4 $\mu$m to 1.6 $\mu$m range for the related transition. Transitions in this wavelength range and their particular wavelengths are as follows:

| Transition | Wavelength ($\mu$m) |
|---|---|
| $2p_8$-$3d_1''$ | 1.5243 |
| $2p_{10}$-$3d_3$ | 1.5339 |
| $2p_6$-$2s_5$ | 1.5376 |

In addition to the transition lines described above, the following transition lines are exhibited by Krypton:

| Transition | Wavelength ($\mu$m) |
|---|---|
| $1s_3$-$2p_7$ | 1.2865 |
| $2p_{10}$-$3d_1''$ | 1.2988 |
| $2p_8$-$2s_4$ | 1.3181 |
| $2p_7$-$2s_5$ | 1.5009 |
| $2p_9$-$3d_1''$ | 1.5213 |
| $2p_6$-$3d_2$ | 1.5330 |
| $1s_2$-$2p_8$ | 1.5478 |

In addition to the atomic transition lines described above, it has been found that a gas discharge lamp containing the noble gas species Xenon exhibits useful long wavelength transitions at: $3p_7$-$2s_4$ (1.5422 $\mu$m), $2p_7$-$2s_4$ (1.5418 $\mu$m), $2p_8$-$2s_5$ (1.4732 $\mu$m), $2p_9$-$2s_4$ (1.3657 $\mu$m), and $2p_{10}$-$2s_5$ (1.2623 $\mu$m). Also, it has been found that a gas discharge lamp containing the noble gas species Neon exhibits useful long wavelength transitions at: $2p_4$-$2s_5$ (1.2915 $\mu$m), $2p_2$-$2s_5$ (1.3228 $\mu$m), and $2p_1$-$3s_2$ (1.5243 $\mu$m). These transitions are useful for long wavelength laser stabilization and are shown for purposes explanation, not for purposes of limitation. Additional information about transition lines and related species may be found in the following references: *Journal of Physical and Chemical Reference Data*, Vol. 3, No. 4, pp. 825-95 (1974); C. B. Moore, *Atomic Energy Levels*, National Bureau of Standards, pp 467, (1949); and Reader et al. eds., *Wavelengths and Transition Probabilities for Atoms and Atomic Ions* National Bureau of Standards (1980).

While the latter portion of this description has disclosed operation and frequency stabilization in the long wavelength regime, it is understood that the principles of this invention apply with equal force to operation and frequency stabilization in the shorter wavelength regime using known atomic and molecular transition lines via the optogalvanic effect.

Additional benefits which accrue from the use of this invention are that absolute frequency standard elements are small, inexpensive, efficient, stable and reproducible.

It will be apparent to those skilled in the art that, while the exemplary embodiments of the invention have utilized the optogalvanic effect, absorption effects can also be used. However, the optogalvanic effect is preferred because it eliminates the need for a photodetector in the feedback control circuit to monitor the absorption by the excited state atomic or molecular line in the gas discharge element.

I claim:

1. A lightwave communication system comprising a transmitter and a receiver for communicating with each other over a transmission medium, said transmitter and said receiver each including a laser and a laser stabilization arrangement for controlling said laser coupled thereto to generate an optical signal at a predetermined wavelength, each said laser stabilization arrangement comprising a gas discharge element for generating an optogalvanic signal in response to said optical signal from the laser associated therewith, said gas discharge element including atomic species having an atomic transition line at said predetermined wavelength, and feedback control means responsive to said optogalvanic signal for dynamically adjusting a characteristic of said laser to correct a wavelength of the optical signal from said laser to be substantially equal to said predetermined wavelength.

2. The lightwave communication system as defined in claim 1 wherein said gas discharge element includes a hollow cathode lamp having enclosure means for containing said atomic species, said enclosure means being substantially transparent at said predetermined wavelength.

3. The lightwave communication system as defined in claim 1 or 2 wherein said atomic species is selected from the group consisting of neon, argon, krypton and xenon.

4. A lightwave communication system comprising a transmitter and a receiver for communicating with each other over a transmission medium, said transmitter and said receiver each including a laser and a laser stabilization arrangement for controlling said laser coupled thereto to generate an optical signal at a predetermined wavelength, each said laser stabilization arrangement comprising a gas discharge element for generating an optogalvanic signal in response to said optical signal from the laser associated therewith, said gas discharge element including molecular species having a molecular transition line at said predetermined wavelength, and feedback control means responsive to said optogalvanic signal for dynamically adjusting a characteristic of said laser to correct a wavelength of the optical signal from said laser to be substantially equal to said predetermined wavelength.

5. The lightwave communication system as defined in claim 4 wherein said gas discharge element includes a hollow cathode lamp having enclosure means for containing said molecular species, said enclosure means being substantially transparent at said predetermined wavelength.

6. The lightwave communication system as defined in claim 4 or 5 wherein said molecular species is selected from the group consisting of ammonia, hydrogen fluoride, and water vapor.

7. The lightwave communication system as defined in claim 1 or 4 wherein each said feedback control means includes oscillator means for generating a dither signal, means responsive to said dither signal for synchronously detecting said optogalvanic signal to generate a correction signal, and bias means responsive to said correction signal and said dither signal for supplying drive current to said laser so that said laser emits said optical signal at said wavelength substantially equal to said predetermined wavelength.

8. The lightwave communication system as defined in claim 7 wherein said gas discharge element includes a hollow cathode lamp having enclosure means for containing said species, said enclosure means being substantially transparent at said predetermined wavelength.

9. The lightwave communication system as defined in claim 7 wherein said gas discharge element includes an indicator lamp having enclosure means for containing said species, said enclosure means being substantially transparent at said predetermined wavelength.

10. A lightwave communication system comprising a transmitter and a receiver for communicating with each other over a transmission medium, said transmitter and said receiver each including a laser and a laser stabilization arrangement for controlling said laser coupled thereto, said laser stabilization arrangement at said transmitter comprising a gas discharge element for generating an optogalvanic signal in response to an optical output signal from the laser associated therewith, said gas discharge element including atomic species having an atomic transition line at a first predetermined wavelength, and feedback control means responsive to said optogalvanic signal for dynamically adjusting a characteristic of said laser to correct a wavelength of the optical signal from said laser at the transmitter to be substantially equal to said first predetermined wavelength, said laser stabilization arrangement at said receiver comprising a gas discharge element for generating an optogalvanic signal in response to an optical output signal from the laser associated therewith, said gas discharge element including atomic species having an atomic transition line at said first predetermined wavelength, means for generating an electromagnetic field through said gas discharge element to shift said atomic transition line to appear at a second predetermined wavelength, and feedback control means responsive to said optogalvanic signal for dynamically adjusting a characteristic of said laser to correct a wavelength of the optical signal from said laser at the receiver to be substantially equal to said the second predetermined wavelength.

11. A lightwave communication system comprising a transmitter and a receiver for communicating with each other over a transmission medium, said transmitter and said receiver each including a laser and a laser stabilization arrangement for controlling said laser coupled thereto, said laser stabilization arrangement at said transmitter comprising a gas discharge element for generating an optogalvanic signal in response to an optical output signal from the laser associated therewith, said gas discharge element including molecular species having an molecular transition line at a first predetermined wavelength, and feedback control means responsive to said optogalvanic signal for dynamically adjusting a characteristic of said laser to correct a wavelength of the optical signal from said laser at the transmitter to be substantially equal to said first predetermined wavelength, said laser stabilization arrangement at said receiver comprising a gas discharge element for generating an optogalvanic signal in response to an optical output signal from the laser associated therewith, said gas discharge element including molecular species having an molecular transition line at said first predetermined wavelength, means for generating an electromagnetic field through said gas discharge element to shift said molecular transition line to appear at a second predetermined wavelength, and feedback control means responsive to said optogalvanic signal for dynamically adjusting a characteristic of said laser to correct a wavelength of the optical signal from said laser at the receiver to be substantially equal to said the second predetermined wavelength.

* * * * *